(12) United States Patent
Cohen et al.

(10) Patent No.: US 8,362,596 B2
(45) Date of Patent: Jan. 29, 2013

(54) ENGINEERED INTERCONNECT DIELECTRIC CAPS HAVING COMPRESSIVE STRESS AND INTERCONNECT STRUCTURES CONTAINING SAME

(75) Inventors: Stephan A. Cohen, Yorktown Heights, NY (US); Alfred Grill, Yorktown Heights, NY (US); Thomas J. Haigh, Jr., Albany, NY (US); Xiao H. Liu, Yorktown Heights, NY (US); Son V. Nguyen, Yorktown Heights, NY (US); Thomas M. Shaw, Yorktown Heights, NY (US); Hosadurga Shobha, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 12/502,690

(22) Filed: Jul. 14, 2009

(65) Prior Publication Data

US 2011/0012238 A1    Jan. 20, 2011

(51) Int. Cl.
*H01L 23/58* (2006.01)
*H01L 21/302* (2006.01)

(52) U.S. Cl. ........ 257/637; 257/640; 257/649; 257/751; 257/E23.167; 257/E21.302; 438/744; 438/761

(58) Field of Classification Search .................. None
See application file for complete search history.

(56) References Cited

U.S. PATENT DOCUMENTS

| | | | |
|---|---|---|---|
| 6,352,917 B1 * | 3/2002 | Gupta et al. | 438/622 |
| 6,677,224 B2 * | 1/2004 | Tseng | 438/593 |
| 6,897,144 B1 | 5/2005 | Ngo et al. | |
| 7,109,098 B1 | 9/2006 | Ramaswamy et al. | |
| 7,138,717 B2 * | 11/2006 | Wang et al. | 257/760 |
| 7,312,148 B2 | 12/2007 | Ramaswamy et al. | |
| 7,312,162 B2 | 12/2007 | Ramaswamy et al. | |
| 7,323,401 B2 | 1/2008 | Ramaswamy et al. | |
| 7,399,364 B2 | 7/2008 | Nguyen et al. | |
| 7,575,970 B2 * | 8/2009 | Ho et al. | 438/246 |
| 7,576,003 B2 * | 8/2009 | Yang et al. | 438/675 |
| 2006/0105570 A1 * | 5/2006 | Hautala et al. | 438/687 |
| 2006/0269692 A1 | 11/2006 | Balseanu et al. | |
| 2007/0032082 A1 | 2/2007 | Ramaswamy et al. | |
| 2007/0123044 A1 * | 5/2007 | Hohage et al. | 438/687 |
| 2008/0020591 A1 | 1/2008 | Balseanu et al. | |

* cited by examiner

*Primary Examiner* — Alonzo Chambliss

(74) *Attorney, Agent, or Firm* — Scully, Scott, Murphy & Presser, P.C.; Louis J. Percello, Esq.

(57) ABSTRACT

A dielectric capping layer having a dielectric constant of less than 4.2 is provided that exhibits a higher mechanical and electrical stability to UV and/or E-Beam radiation as compared to conventional dielectric capping layers. Also, the dielectric capping layer maintains a consistent compressive stress upon post-deposition treatments. The dielectric capping layer includes a tri-layered dielectric material in which at least one of the layers has good oxidation resistance, is resistance to conductive metal diffusion, and exhibits high mechanical stability under at least UV curing. The low k dielectric capping layer also includes nitrogen content layers that contain electron donors and double bond electrons. The low k dielectric capping layer also exhibits a high compressive stress and high modulus and is stable under post-deposition curing treatments, which leads to less film and device cracking and improved device reliability.

24 Claims, 1 Drawing Sheet

ENGINEERED INTERCONNECT DIELECTRIC CAPS HAVING COMPRESSIVE STRESS AND INTERCONNECT STRUCTURES CONTAINING SAME

BACKGROUND

The present application relates generally to integrated circuit (IC) chips, and more particularly to a dielectric cap for use with a back-end-of-the-line (BEOL) interconnect structure, especially a BEOL interconnect structure including Cu embedded within an ultra-low k dielectric constant dielectric material.

Generally, semiconductor devices include a plurality of circuits which form an IC fabricated on a semiconductor substrate. A complex network of signal paths will normally be routed to connect the elements distributed on the surface of the semiconductor substrate. Efficient routing of these signals across the device requires the formation of multilevel or multilayered schemes, such as, for example, single and dual damascene interconnect structures. Within a typical interconnect structure, metal vias run perpendicular to the semiconductor substrate, while metal lines run parallel to the semiconductor substrate.

In traditional interconnect structures, aluminum and aluminum alloys have been used as interconnect metallurgies for providing electrical connections to and from devices in BEOL layers of the devices. While aluminum-based metallurgies have been the material of choice for use as metal interconnects in the past, aluminum no longer satisfies requirements as circuit density and speeds for IC chips increase and the scale of the devices decrease to nanometer dimensions. Thus, copper and copper alloys are being employed as a replacement for aluminum-based metallurgy in nano electronic devices because Cu-based metallurgies have lower resistivity and lower susceptibility to electromigration failure as compared to aluminum-based metallurgies.

One challenge to using copper-based metallurgies is that copper diffuses readily into the surrounding dielectric material as processing steps continue. To inhibit copper diffusion, copper-containing interconnects can be isolated by employing protective barrier layers. Such barrier layers include, for example, conductive diffusion barrier liners of tantalum, titanium or tungsten, in pure form, alloyed form or nitride form. These traditional barrier layers are located along the sidewalls and bottom of the copper-containing interconnect structure.

In addition to using such conductive diffusion barrier liners, capping layers are typically disposed on at least the copper surface of the interconnect structure. Dielectric capping layers such as, for example, silicon nitride, have been most commonly used to cap the upper surface of the metal interconnect structure. Recently, inorganic capping layers including, for example, CoWP, have been used as the metal interconnect capping layer.

A conventional interconnect structure utilizing copper metallization and capping layers as described above typically includes a lower substrate which may contain logic circuit elements such as transistors. An interlevel dielectric (ILD) overlies the substrate. The ILD in past interconnect structures was typically comprised of silicon dioxide. However, in more recent and advanced interconnect structures, the ILD is preferably a SiCOH dielectric or polymeric thermoset material having a dielectric constant of less than or equal to 3.0. An adhesion promoter may be disposed between the substrate and the ILD. A hard mask such as, for example, a silicon nitride hard mask, can optionally be formed atop the ILD. The hard mask may also be referred to as a polish stop layer. At least one conductive material is embedded within the ILD. The conductive material is typically copper in advanced interconnect structures, but alternatively may be aluminum or other conductive materials. When the conductive material is copper, a diffusion barrier liner, as discussed above, is typically disposed between the ILD and the copper metallurgy.

An upper surface of conductive material is typically made coplanar with an upper surface of the hard mask, if present, or the upper surface of the ILD, if the hard mask is not present. A capping layer, as mentioned above, is then typically disposed on the conductive material and either the hard mask, if present, or the ILD, if the hard mask is not present. The capping layer acts as a diffusion barrier to prevent diffusion of the conductive material such as Cu into the surrounding ILD.

High density plasma (HDP) chemical vapor deposition (CVD) capping layers provide superior electromigration protection, as compared to plasma enhanced (PE) CVD films, because HDP CVD films more readily stop the movement of metallic atoms, e.g., copper atoms, along the interconnect surface in the capping layer.

Recently, the use of ultra low dielectric constant dielectric materials (i.e., k equal to or less than 3.0) for BEOL interconnects has turned to low k two phase porous SiCOH or polymeric thermoset dielectric materials. These dielectric materials require the use of a post curing step using ultraviolet (UV) or electron beam (E-Beam) radiation. This post cure UV radiation, for example, causes tensile stress change in the capping layer. In particular, UV exposure changes the stress of most prior art capping layers from compressive stress, which is preferred, to tensile stress, which is less preferred. Moreover, UV exposure causes prior art capping layers to crack and an adhesion problem between the capping layer and the ultra low dielectric constant dielectric material may arise. Any crack in the capping layer may lead to metallic diffusion into the ILD layer through the seam leading to formation of a metallic nodule under the capping layer. Such a metallic nodule may lead to short circuits due to leakage of current between adjacent interconnect lines.

UV and/or E-beam radiation may also cause other damage such as, for example, increased tensile stress, delamination and blister formation over patterned interconnect lines, particularly during subsequent dielectric depositions, metallization, and chemical-mechanical polishing. Furthermore, the need for reducing capacitance in advanced nano electronic devices also requires that the overall dielectric constant of the capping layer be lowered below that of silicon nitride (k~7.0) and silicon carbon nitride (SiCN, k~5.5) capping layers.

Additionally, the use of an ultra-low k porous p-SiCOH ILD, which is a mostly tensile dielectric film, requires that the capping layer must maintain a high compressive stress, to balance out the tensile force in thicker p-SiCOH ILD, as-deposited and upon subsequent UV/E-beam/thermal processing steps. Furthermore, the deposition of these capping layers must not cause any subsequent chemical or electrical damage to the ultra low dielectric constant dielectric materials and metal surfaces that are in contact with the capping layers. Otherwise, the damage to the ultra low dielectric constant dielectric materials and metal surfaces may cause degradation in subsequent fabrication steps and process integration control, in device's performance, yields and reliability.

BRIEF SUMMARY

In one aspect of the invention, a dielectric capping layer that has a low dielectric constant of less than conventionally used silicon nitride and silicon carbon nitride, and a higher mechanical and electrical stability to UV and/or E-Beam radiation as compared to the aforementioned dielectric capping layers is described. The dielectric capping layer maintains a compressive stress upon post-deposition curing steps, and causes no damage to the contact deposition surfaces.

The dielectric capping layer mentioned above includes a tri-layered dielectric material having a dielectric constant of about 4.0 or less in which at least one of the layers has good oxidation resistance, is resistance to metal diffusion, and exhibits high mechanical stability under at least UV curing. The dielectric capping layer also includes nitrogen containing layers. The dielectric capping layer further exhibits a high compressive stress (on the order of 400 MPa or greater) and a high modulus (on the order of 30 GPa or greater) and is stable under post-deposition curing treatments, which leads to less film and device cracking and improved device reliability.

Specifically, the dielectric capping layer includes, from bottom to top, a first dielectric layer comprising a nitrogen-containing material having a first thickness and a first compressive stress which is disposed under conditions that cause no damage to an underlying material, a second dielectric layer having a second thickness and a second compressive stress located on the first dielectric layer, wherein the second thickness is greater than the first thickness and the second compressive stress is greater than the first compressive stress, and a third dielectric layer having a third thickness and a dielectric constant of less than 3.5 located on the second dielectric layer, and wherein the third thickness is greater than the sum of the first thickness and the second thickness, and wherein the dielectric capping layer has an intrinsic compressive stress even after exposure to UV irradiation.

In one embodiment of the invention, the dielectric capping layer is located atop at least an upper surface of a conductive material, preferably a copper surface, which is embedded within a dielectric material, preferably an ultra low k dielectric material having a dielectric constant of 3.5 or less.

In another aspect of the invention, a method of fabricating the dielectric capping layer mentioned above is provided as well as a method of fabricating an interconnect structure that includes the dielectric capping layer disposed on at least an upper surface of a conductive material, preferably a copper surface, that is embedded within an ILD, preferably, an ultra low dielectric constant dielectric material having a dielectric constant of 3.5 or less.

The method of forming the dielectric capping layer includes, first depositing a first dielectric layer including a nitrogen-containing material having a first thickness and a first compressive stress which is disposed under conditions that cause no damage to an underlying material. Next, a second depositing step is performed that forms a second dielectric layer having a second thickness and a second compressive stress on the first dielectric layer, wherein the second thickness is greater than the first thickness and the second compressive stress is greater than the first compressive stress. Next, a third depositing step is performed that forms a third dielectric layer having a third thickness and a dielectric constant of less than 3.5 on the second dielectric layer, wherein the third thickness is greater than the sum of the first thickness and the second thickness, and wherein the dielectric capping layer has an intrinsic compressive stress even after exposure to UV irradiation.

DETAILED DESCRIPTION

Figure 1:
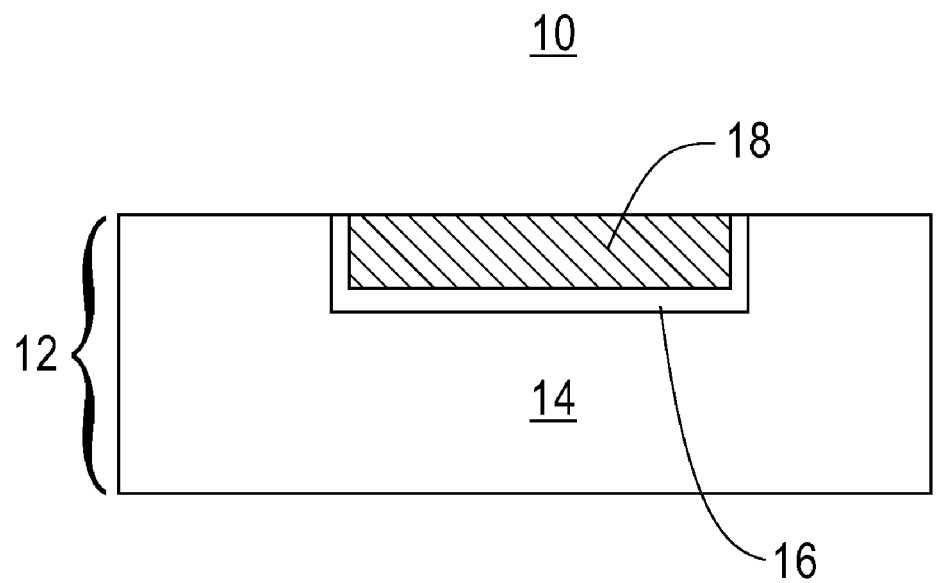
FIG. 1 is a pictorial representation (through a cross sectional view) illustrating an initial interconnect structure that can be employed in an embodiment of the invention.

The present invention, which provides a dielectric capping layer having compressive stress even after post-deposition treatments, a method of fabricating the dielectric capping layer, and an interconnect structure including the dielectric capping layer, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, and in one embodiment of the invention, a dielectric capping layer is provided that includes a tri-layered dielectric material having a dielectric constant of about 4.0 or less in which at least one of the layers has good oxidation resistance, is resistance to conductive metal diffusion, and exhibits high mechanical stability under at least UV curing. The dielectric capping layer also includes nitrogen containing layers. The dielectric capping layer further exhibits a high compressive stress (on the order of 400 MPa or greater) and a high modulus (on the order of 30 GPa or greater) and is stable under post-deposition curing treatments, which leads to less film and device cracking and improved device reliability.

Specifically, the dielectric capping layer includes, from bottom to top, a first dielectric layer including a nitrogen-containing material having a first thickness and a first compressive stress which is disposed under conditions that cause no damage to an underlying material, a second dielectric layer having a second thickness and a second compressive stress located on the first dielectric layer, wherein the second thickness is greater than the first thickness and the second compressive stress is greater than the first compressive stress, and a third dielectric layer having a third thickness and a dielectric constant of less than 3.5 located on the second dielectric layer, wherein the third thickness is greater than the sum of the first thickness and the second thickness, and wherein the dielectric capping layer has an intrinsic compressive stress even after exposure to UV irradiation.

The dielectric capping layer and method for forming the same will now be described in greater detail by referring to an embodiment of the invention in which the dielectric capping layer is disposed on an upper surface of an initial interconnect structure. Although this embodiment is particularly shown and illustrated, the dielectric capping layer can be formed atop other structures including at least an underlying conductive material that is susceptible to oxidation.

The embodiment in which the dielectric capping layer mentioned above is formed on an upper surface of an interconnect structure begins by first providing the initial interconnect structure 10 shown in FIG. 1. Specifically, the initial interconnect structure 10 shown in FIG. 1 comprises a lower interconnect level 12 of an interconnect structure that includes a dielectric material 14 having at least one conductive feature (i.e., conductive region) 18 embedded therein which is separated from the dielectric material 14 by a barrier layer 16.

The initial interconnect structure 10 shown in FIG. 1 is made utilizing standard interconnect processing which is well known in the art. For example, the initial interconnect structure 10 can be formed by first applying the dielectric material 14 to a surface of a substrate (not shown). The substrate, which is not shown, may comprise a semiconducting material, an insulating material, a conductive material or any combination thereof When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The dielectric material 14 of the lower interconnect level 12 may comprise any interlevel or intralevel dielectric including inorganic dielectrics or organic dielectrics. The dielectric material 14 may be porous or non-porous. Some examples of suitable dielectrics that can be used as the dielectric material 14 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 14 typically has a dielectric constant that is about 4.0 or less, with a dielectric constant of about 3.5 or less being even more typical. It is noted that all dielectric constants reported herein are measured relative to a vacuum and that dielectric materials having a dielectric constant of about 3.5 or less are referred to as low or ultra low k dielectric materials. The dielectrics mentioned above reduce the parasitic crosstalk as compared with dielectric materials that have a dielectric constant of 4.0 or higher. The thickness of the dielectric material 14 may vary depending upon the technology node and the location in the BEOL interconnect structure. Typically, and for normal interconnect structures, the dielectric material 14 has a thickness from 50 nm to 450 nm.

The lower interconnect level 12 also has at least one conductive feature 18 that is embedded in (i.e., located within) the dielectric material 14. The least one conductive feature 18 comprises a conductive region that is separated from the dielectric material 14 by a barrier layer 16. The at least one conductive feature 18 is formed by lithography (i.e., applying a photoresist to the surface of the dielectric material 14, exposing the photoresist to a desired pattern of radiation, and developing the exposed resist utilizing a conventional resist developer), etching (dry etching or wet etching) at least one opening in the dielectric material 14 and filling the etched region with the barrier layer 16 and then with a conductive material forming the conductive region. The at least one opening may be a via opening, a line opening, or a combined via and line opening.

The barrier layer 16, which may comprise Ta, TaN, Ti, TiN, Ru, RuN, W, WN, Co, Mn, a combination thereof or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 16 may vary depending on the exact BEOL structure process as well as the material employed. Typically, the barrier layer 16 has a thickness from 2 nm to 40 nm, with a thickness from 7 nm to 20 nm being more typical.

Following the barrier layer 16 formation, the remaining region of the at least one opening within the dielectric material 14 is filled with a conductive material forming the at least one conductive feature 18. The conductive material used in forming the at least one conductive feature 18 includes, for example, polySi, a conductive metal, an alloy comprising at least one conductive metal, a conductive metal silicide or combinations thereof Preferably, the conductive material that is used in forming the at least one conductive feature 18 is a conductive metal such as Cu, W or Al, with Cu or a Cu alloy (such as CuAl, CuMn) being highly preferred in the present invention. The conductive material is filled into the remaining opening in the dielectric material 14 utilizing a conventional deposition process including, but not limited to CVD, PECVD, sputtering, chemical solution deposition or plating. After deposition, a conventional planarization process such as, for example, chemical mechanical polishing (CMP) can be used to provide a structure in which the barrier layer 16 and the conductive feature 18 each have an upper surface that is substantially coplanar with the upper surface of the dielectric material 14.

Figure 2:
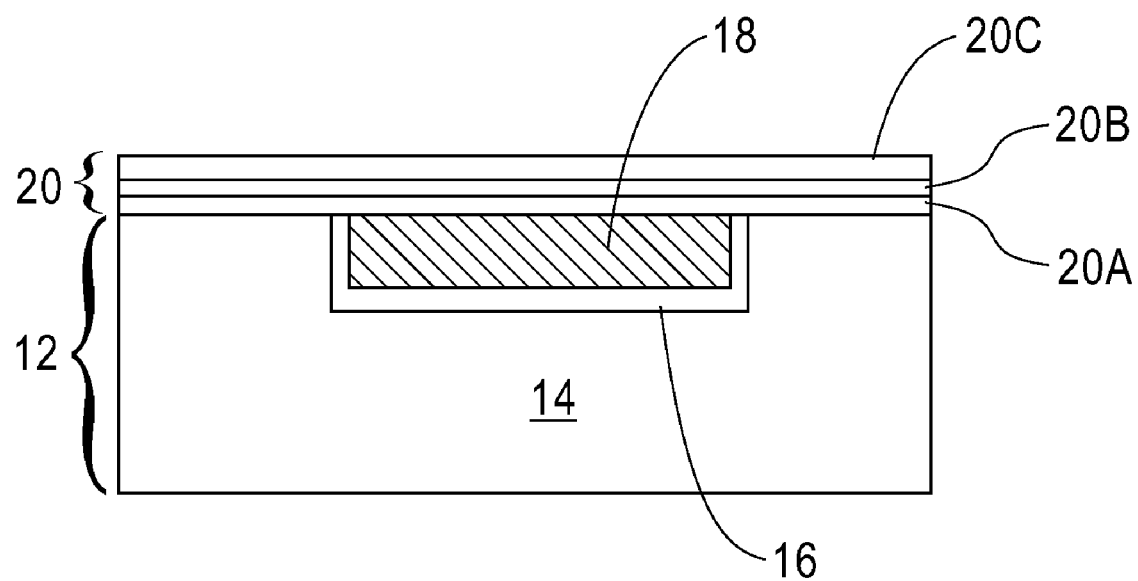
FIG. 2 is a pictorial representation (through a cross sectional view) illustrating the initial interconnect structure of FIG. 1 after forming a dielectric capping layer thereon.

Next, and as shown in FIG. 2, a dielectric capping layer 20 is formed atop the initial structure 10 shown in FIG. 1 including atop upper exposed surfaces of the at least one conductive feature 18, the barrier layer 16 as well as the dielectric material 14. The dielectric capping layer 20 includes a tri-layer dielectric stack that has a very high compressive stress after deposition that is on the order of 200 MPa or greater, with a compressive stress of from 400 MPa to 1000 MPa being more preferred. In one embodiment, the 'intrinsic' compressive stress of the dielectric capping layer 20 is from 200 MPa to 2000 MPa. The compressive stress of the as-deposited dielectric capping layer 20 is maintained even after a post-deposition curing process is performed. When the dielectric capping layer 20 is formed within an interconnect structure, it improves the interconnect structure's resistance to cracking and thus improves the device structure reliability.

The dielectric capping layer 20 typically has a dielectric constant of 4.0 or less, with a dielectric constant from 3.6 to 4.0 being even more typical. The dielectric constant of the dielectric capping layer 20 is at least 20% lower than the dielectric constant of a conventional SiCN dielectric cap. Moreover, the dielectric capping layer 20 is formed under conditions such that no damage is introduced into the underlying dielectric material 14 and it exhibits good oxidation and diffusion barrier properties.

The dielectric capping layer 20 shown in FIG. 2 comprises at least three dielectric material layers including, from bottom to top, a first dielectric layer 20A, a second dielectric layer 20B and a third dielectric layer 20C.

The first dielectric layer 20A of the dielectric capping layer 20 comprises a nitrogen-containing material including, for example, silicon nitride, boron nitride, silicon boron nitride, silicon boron nitride carbon, silicon carbon nitride or carbon boron nitride. In one embodiment of the invention, the first dielectric layer 20A comprises silicon nitride. When carbon is present, the content of carbon is typically from 15 to 40 atomic %.

The first dielectric layer 20A of the dielectric capping layer 20 has a first thickness and a first compressive stress. The first thickness of first dielectric layer 20A is typically from 0.5 nm to 5 nm, with a first thickness from 1 nm to 2 nm being even more typical. The first compressive stress of the first dielectric layer 20A is typically from 500 MPa to 2000 MPa, with a first compressive stress value from 800 MPa to 1200 MPa being even more typically.

The first dielectric layer 20A of the dielectric capping layer 20 is formed by deposition under deposition conditions that cause no damage to an underlying material such as dielectric material 14. Suitable deposition processing that can be used in forming the first dielectric layer 20A include, but are not limited to plasma enhanced chemical vapor deposition (PECVD), thermal chemical vapor deposition, atomic layer deposition (ALD), plasma enhanced atomic layer deposition (PE-ALD) or spin-on methods.

When PECVD is employed to form the first dielectric layer 20A of the dielectric capping layer 20, the PECVD conditions include a low rf power of less than 125 W for a 300 mm diameter wafer, with a rf power of from 50 W to 100 W being even more preferred. Typically, PECVD of the first dielectric layer 20A is performed using an ultra low power density of less than 0.15 W/cm$^2$, with a power density from 0.04 W/cm$^2$ to 0.1 W/cm$^2$ being even more typical.

When thermal chemical vapor deposition, ALD or PE-ALD are employed to form the first dielectric layer 20A, a deposition temperature of 400° C. or less is used. The deposition typically occurs without the use of halide (F, Cl, Br, I) based precursors to prevent subsequent damage to the underlying dielectric materials. If the dielectric is silicon nitride, typical SiH$_4$/NH$_3$ precursors are normally used for the deposition.

When spin-on techniques are employed in forming the first dielectric layer 20A, the spin-on conditions include a thermal curing temperature of 400° C. or less. The spin-on deposition typically occurs without halide (F, Cl, Br, I) spin on precursors to prevent subsequent reactions that cause damage to the underlying dielectric materials. Typical spin-on precursors are hexamethyldisilazane and N,N-diethylaminotrimethylsilane (HMDS and DEATS, respectively).

After forming the first dielectric layer 20A of the dielectric capping layer 20, a second dielectric layer 20B having a second thickness and a second compressive stress is formed on the first dielectric layer 20A. The second thickness of the second dielectric layer 20B of the dielectric capping layer 20 is greater than the first thickness of the first dielectric layer 20A. Also, the second compressive stress of the second dielectric layer 20B is greater than the first compressive stress of the first dielectric layer 20A.

In particular the second dielectric layer 20B of the dielectric capping layer 20 typically has a thickness, e.g., a second thickness as mentioned above, from 1 nm to 20 nm, with a thickness from 3 nm to 7 nm being even more typical. The second compressive stress of the second dielectric layer 20B of the dielectric capping layer 20 is typically from 800 MPa to 2500 MPa, with a compressive stress from 1000 MPa to 1800 MPa being even more typical.

The second dielectric layer 20B of the dielectric capping layer 20 comprises the same or different nitrogen-containing material as the first dielectric layer 20A. In one embodiment of the invention, the first and second dielectric layers are comprised of the same nitrogen-containing material such as, for example, silicon nitride, boron nitride, silicon boron nitride, silicon boron nitride carbon, silicon carbon nitride or carbon boron nitride. In another embodiment of the invention, the first and second dielectric layers are each comprised of silicon nitride.

The second dielectric layer 20B of the dielectric capping layer 20 is formed by a process in which a dielectric material is deposited having the second compressive stress mentioned above. Typically, the second dielectric layer 20B is formed by PECVD in which a high rf power of 800 W or greater is employed for a 300 mm diameter wafer (about 1 w/cm$^2$). In a preferred embodiment, the second dielectric layer 20B of the dielectric capping layer 20 is formed by PECVD in which a rf power range from 400 W (~0.5/cm$^2$) to 1200 W (~1.5 w/cm$^2$) is being even employed. Other deposition processes, such as, plasma enhanced atomic layer deposition (PE_ALD), thermal chemical vapor deposition (CVD) and atomic layer deposition (ALD), can be used besides PECVD.

After forming the second dielectric layer 20B, a third dielectric layer 20C having a third thickness is formed on the second dielectric layer 20B. The third thickness of the third dielectric layer 20C is greater than the sum of the first thickness of the first dielectric layer 20A and the second thickness of the second dielectric layer 20B. Typically, the third thickness of the third dielectric layer 20C of the dielectric capping layer 20 is from 7 nm to 70 nm, with a third thickness of from 10 nm to 35 nm being even more typical.

The third dielectric layer 20C of the dielectric capping layer includes any dielectric material having a dielectric constant of less than 3.5, preferably less than 3.2, more preferably less than 2.8. Illustrative examples of dielectric materials that have a dielectric constant within the range mentioned above are silicon carbon nitride, silicon carbide, carbon boron nitride, boron nitride, carbon doped oxide, and silicon carbon boron nitride. In one embodiment, the third dielectric layer 20C of the dielectric capping layer 20 is a carbon-rich SiCN$_x$ material having a carbon content of equal to, or greater than 50 atomic % and a nitrogen concentration of less than 5 atomic %.

It is noted that the deposition of the various dielectric layers of the dielectric capping layer 20 may be performed with, or without breaking vacuum between each of the deposition steps. It is also noted that the various dielectric layers of the dielectric capping layer 20 can be deposited in the same deposition tool, or in different deposition tools, as used for the previously deposited dielectric layer.

After forming the dielectric capping layer 20 mentioned above, the structure shown in FIG. 2 is optionally subjected to a post-deposition curing step. The post-deposition curing step may include thermal, UV light, electron beam irradiation, chemical energy, or a combination of more than one of these. In a preferred embodiment, the structure including the dielectric capping layer 20 is placed in an ultraviolet (UV) treatment tool, with a controlled environment (vacuum or ultra pure inert gas with a low $O_2$ and $H_2O$ concentration). A pulsed or continuous UV source may be used.

It is noted that after performing the post-deposition curing step, the dielectric capping layer 20 maintains compressively stressed. Since the cured dielectric capping layer 20 maintains its' compressive stress, interconnect structures including the dielectric capping layer 20 do not exhibit cracking and/or adhesion problems that are typically associated with prior art dielectric capped interconnect structures.

After the post-deposition curing step, further interconnect processing steps including the formation of additional interconnect levels atop the structure shown in FIG. 2 can be performed. The additional interconnect level can be capped with the dielectric capping layer 20 of the present application.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A dielectric cap comprising, from bottom to top:
   a first dielectric layer comprising a nitrogen-containing material having a first thickness and a first compressive stress which is disposed under conditions that cause no damage to an underlying material and wherein said first dielectric layer is a non-high density plasma nitride layer and is a bottommost layer of said dielectric cap;
   a second dielectric layer having a second thickness and a second compressive stress located on the first dielectric layer, wherein the second thickness is greater than the first thickness and the second compressive stress is greater than the first compressive stress; and
   a third dielectric layer having a third thickness and a dielectric constant of less than 3.5 located on the second dielectric layer, and wherein the third thickness is greater than the sum of the first thickness and the second thickness,
   wherein the entire dielectric cap has an intrinsic compressive stress.

2. The dielectric cap of claim 1 wherein said first dielectric layer of the dielectric cap and the second dielectric layer of the dielectric cap are composed of the same or different dielectric material, said dielectric material comprises silicon nitride, boron nitride, silicon boron nitride, silicon boron nitride carbon, silicon carbon nitride or carbon boron nitride.

3. The dielectric cap of claim 1 wherein said third dielectric layer of the dielectric cap is comprised of carbon, silicon and nitrogen.

4. The dielectric cap of claim 1 wherein said first dielectric layer compressive stress is from 500 MPa to 2000 MPa, and said second dielectric layer compressive stress is from 800 MPa to 2500 MPa.

5. The dielectric cap of claim 1 wherein said first dielectric layer is comprised of silicon nitride, said second dielectric layer is comprised of silicon nitride and said third dielectric layer is comprised of silicon carbon nitride, silicon carbide, boron nitride, carbon boron nitride, or silicon carbon boron nitride.

6. The dielectric cap of claim 1 wherein said intrinsic compressive stress is from 200 MPa to 2000 MPa.

7. The dielectric cap of claim 1 wherein said third dielectric layer of the dielectric cap is a SiCN dielectric material having a carbon content of greater than 50 atomic % and a nitrogen content of less than 5 atomic percent.

8. The dielectric cap of claim 1 wherein said first dielectric layer of the dielectric cap is selected from the group consisting of SiBNC and CNB.

9. An interconnect structure comprising:
   a dielectric material having at least one conductive feature embedded therein, said at least one conductive feature having an upper exposed surface; and
   a dielectric cap located on at least said upper exposed surface of the at least one conductive feature, said dielectric cap comprising, from bottom to top, a first dielectric layer comprising a nitrogen-containing material having a first thickness and a first compressive stress which is disposed under conditions that cause no damage to the underlying dielectric material and wherein said first dielectric layer is a non-high density plasma nitride layer and is a bottommost layer of said dielectric cap, a second dielectric layer having a second thickness and a second compressive stress located on the first dielectric layer, wherein the second thickness is greater than the first thickness and the second compressive stress is greater than the first compressive stress, and a third dielectric layer having a third thickness and a dielectric constant of less than 3.5 located on the second dielectric layer, wherein the third thickness is greater than the sum of the first thickness and the second thickness, wherein the dielectric cap has an intrinsic compressive stress.

10. The interconnect structure of claim 9 wherein said dielectric material is one of $SiO_2$, a silsesquioxane, a C doped oxide that includes atoms of Si, C, O and H, or a thermosetting polyarylene ether.

11. The interconnect structure of claim 9 wherein said at least one conductive feature includes an interconnect conductive material selected from a conductive metal, an alloy comprising at least one conductive metal, and a conductive metal silicide.

12. The interconnect structure of claim 11 wherein said interconnect conductive material is a conductive metal selected from the group consisting of Cu, Al, W and AlCu.

13. The interconnect structure of claim 9 wherein said at least one conductive feature is separated from the dielectric material by a diffusion barrier.

14. The interconnect structure of claim 9 wherein said first dielectric layer of the dielectric cap and the second dielectric layer of the dielectric cap are composed of the same or different dielectric material, said dielectric material comprises silicon nitride, boron nitride, silicon boron nitride, silicon boron nitride carbon, silicon carbon nitride or carbon boron nitride.

15. The interconnect structure of claim 9 wherein said third dielectric layer of the dielectric cap is comprised of silicon, carbon and nitrogen, or silicon and carbon.

16. The interconnect structure of claim 9 wherein said third dielectric layer of the dielectric cap is a SiCN dielectric material having a carbon content of greater than 50 atomic % and a nitrogen content of less than 5 atomic percent.

17. A method of forming a semiconductor structure comprising:
   first depositing a first dielectric layer comprising a nitrogen-containing material having a first thickness and a first compressive stress which is disposed under conditions that cause no damage to an underlying material, wherein said first depositing is selected from the group consisting of plasma enhanced chemical vapor deposition, thermal chemical vapor deposition, atomic layer deposition, plasma enhanced atomic layer deposition and spin on coating;

second depositing a second dielectric layer having a second thickness and a second compressive stress on the first dielectric layer, wherein the second thickness is greater than the first thickness and the second compressive stress is greater than the first compressive stress, and wherein said second depositing is selected from the group consisting of plasma enhanced chemical vapor deposition, thermal chemical vapor deposition, atomic layer deposition, plasma enhanced atomic layer deposition; and third depositing a third dielectric layer having a third thickness and a dielectric constant of less than 3.5 on the second dielectric layer, wherein the third thickness is greater than the sum of the first thickness and the second thickness, and wherein the first dielectric layer, the second dielectric layer and the third dielectric layer provide a dielectric cap having an intrinsic compressive stress and wherein said first dielectric layer is a bottommost layer of said dielectric cap.

18. The method of claim 17 wherein said underlying material is a dielectric material having at least one conductive feature embedded therein.

19. The method of claim 17 wherein said first depositing is performed by plasma enhanced chemical vapor deposition using an rf power of about 125 W or less.

20. The method of claim 17 wherein said second depositing is performed by plasma enhanced chemical vapor deposition performed using an rf power of from 400 W to 1200 W.

21. The method of claim 17 further comprising curing the dielectric cap, wherein said dielectric cap after curing maintains said intrinsic compressive stress.

22. The method of claim 17 wherein said first dielectric layer of the dielectric cap and the second dielectric layer of the dielectric cap are composed of the same or different dielectric material, said dielectric material comprises silicon nitride, boron nitride, silicon boron nitride, silicon boron nitride carbon, silicon carbon nitride or carbon boron nitride.

23. The method of claim 17 wherein said third dielectric layer of the dielectric cap is comprised of carbon-rich silicon carbon nitride or silicon carbide.

24. The method of claim 17 wherein said first compressive stress is from 500 MPa to 2000 MPa, and the second compressive stress is from 800 MPa to 2500 MPa.

* * * * *